US012772615B2

(12) United States Patent
Dion et al.

(10) Patent No.: US 12,772,615 B2
(45) Date of Patent: Oct. 20, 2026

(54) MULTI-PERIOD PATTERNED SUBSTRATE

(71) Applicant: Sensor Electronic Technology, Inc., Columbia, SC (US)

(72) Inventors: Joseph Dion, Columbia, SC (US); Rakesh B. Jain, Elgin, SC (US)

(73) Assignee: Sensor Electronic Technology, Inc., Columbia, SC (US)

( * ) Notice: Subject to any disclaimer, the term of this patent is extended or adjusted under 35 U.S.C. 154(b) by 367 days.

(21) Appl. No.: 18/497,281

(22) Filed: Oct. 30, 2023

(65) Prior Publication Data

US 2024/0154062 A1 May 9, 2024

Related U.S. Application Data

(60) Provisional application No. 63/423,107, filed on Nov. 7, 2022.

(51) Int. Cl.

| | |
|---|---|
| ***H10H 20/821*** | (2025.01) |
| ***H01S 5/0234*** | (2021.01) |
| ***H01S 5/125*** | (2006.01) |
| ***H10H 20/01*** | (2025.01) |
| ***H10H 20/811*** | (2025.01) |
| ***H10H 20/824*** | (2025.01) |

(52) U.S. Cl.

CPC ......... *H10H 20/821* (2025.01); *H01S 5/0234* (2021.01); *H10H 20/013* (2025.01); *H10H 20/811* (2025.01); *H10H 20/824* (2025.01); *H01S 5/125* (2013.01)

(58) Field of Classification Search

CPC ................................................... H10H 20/821

See application file for complete search history.

(56) References Cited

U.S. PATENT DOCUMENTS

| | | | | |
|---|---|---|---|---|
| 2010/0032647 | A1 | 2/2010 | Khan et al. | |
| 2015/0295127 | A1 | 10/2015 | Shur et al. | |
| 2017/0229612 | A1 | 8/2017 | Shatalov et al. | |
| 2018/0108806 | A1 | 4/2018 | Jain et al. | |
| 2018/0269355 | A1 * | 9/2018 | Jain ...................... | H10H 20/815 |

FOREIGN PATENT DOCUMENTS

| | | | |
|---|---|---|---|
| JP | 2006278477 | A | 10/2006 |
| JP | 2010219269 | A | 9/2010 |
| WO | 2019068919 | A1 | 4/2019 |

OTHER PUBLICATIONS

International Search Report and Written Opinion for PCT Application No. PCT/US2023/078915, Mar. 4, 2024, 9 pages.

* cited by examiner

*Primary Examiner* — William A Harriston

(74) *Attorney, Agent, or Firm* — LaBatt, LLC

(57) ABSTRACT

A substrate includes structures formed on a growth surface of the substrate. The structures are formed in a multi-periodic pattern, which includes a first plurality of groups of structures. Each group of structures has a characteristic spacing between adjacent structures in the group. Each group of structures is separated from an adjacent group of structures by a second characteristic spacing. The second characteristic spacing is at least 1.5 times larger than the first characteristic spacing.

17 Claims, 9 Drawing Sheets

MULTI-PERIOD PATTERNED SUBSTRATE

REFERENCE TO RELATED APPLICATIONS

The current application claims the benefit of U.S. Provisional Application No. 63/423,107, filed on 7 Nov. 2022, which is hereby incorporated by reference.

TECHNICAL FIELD

The disclosure relates generally to semiconductor devices, and more particularly, to a design of a patterned substrate for subsequent layer growth thereon, e.g., group III-V material growth for an optoelectronic device.

BACKGROUND ART

Optoelectronic semiconductor devices, such as light emitting diodes (LEDs) and laser diodes (LDs), include solid state emitting devices composed of group III-V semiconductors. A subset of group III-V semiconductors includes group III nitride alloys, which can include binary, ternary and quaternary alloys of indium (In), aluminum (Al), gallium (Ga), and/or boron (B) and nitrogen (N). Illustrative group III nitride based optoelectronic devices can be of the form $Al_xGa_yIn_zB_{1-x-y-z}N$, where x, y, and z indicate the molar fraction of a given element, $0 \leq x, y, z \leq 1$, and $0 \leq x+y+z \leq 1$.

Due to the high cost and limited availability of bulk native substrates, group III nitride semiconductor devices are most commonly grown on substrates formed of sapphire, silicon, silicon carbide, or the like. The quality of group III nitride layers grown over these substrates depends strongly on the initiation of growth from the substrate. High quality active layers for group III nitride semiconductor devices were not achieved until the development of a low temperature nucleation layer.

Current state-of-the-art group III nitride semiconductor devices commonly employ a patterned sapphire substrate (PSS) on which growth is initiated. The PSS causes the group III nitride crystal to nucleate in a defined pattern before growing laterally to coalesce into a planar film.

FIGS. 1A and 1B show top and side views, respectively, including an illustrative patterned substrate 2 according to the prior art. As illustrated in FIG. 1A, the growth surface of the substrate 2 can be patterned as represented by the circles 4. The circles can represent holes formed into the top surface of the substrate 2 or pillars of the substrate 2 around which the substrate 2 has been etched. In either case, as shown in FIG. 1B, growth of a group III nitride layer 6 can commence vertically on the top surface of the substrate 2 with some lateral growth. After sufficient growth, the material will coalesce, forming a continuous layer of group III nitride material over the substrate 2.

When creating a pattern for a PSS, an important consideration is the periodic spacing of the pattern. Wider spacing in the pattern can improve the crystal quality of the group III nitride layers by allowing more lateral growth to occur, but at the expense of taking longer for the material to coalesce.

SUMMARY OF THE INVENTION

Aspects of the invention provide a method of fabricating a semiconductor structure with a patterned substrate for improved growth of a semiconductor layer. The pattern on the patterned substrate is multi-periodic. To this extent, the pattern can include a first period with relatively closely spaced structures, which is embedded within a larger second period which can create larger spacing than that of the first period. While two periods are shown and described to illustrate the invention, it is understood that embodiments can include any number of two or more periods.

A semiconductor layer grown on the patterned substrate coalesces the pattern into a planar film. Subsequent growth of the semiconductor material can provide a higher quality of material than that provided by prior art solutions.

In embodiments, a substrate includes structures formed on a growth surface of the substrate. The structures are formed in a multi-periodic pattern, which includes a first plurality of groups of structures. Each group of structures has a characteristic spacing between adjacent structures in the group. Each group of structures is separated from an adjacent group of structures by a second characteristic spacing. The second characteristic spacing is at least 1.5 times larger than the first characteristic spacing.

A first aspect of the invention provides a substrate comprising: a first plurality of structures formed on a growth surface of the substrate, wherein the first plurality of structures are formed in a multi-periodic pattern, the multi-periodic pattern including a first plurality of groups of structures, wherein each group of structures has a first characteristic spacing between adjacent structures in the group of structures, and wherein each group of structures is separated from an adjacent group of structures by a second characteristic spacing, wherein the second characteristic spacing is at least 1.5 times larger than the first characteristic spacing.

A second aspect of the invention provides a semiconductor device comprising: a substrate including a first plurality of structures formed on a growth surface of the substrate, wherein the first plurality of structures are formed in a multi-periodic pattern, the multi-periodic pattern including a first plurality of groups of structures, wherein each group of structures has a first characteristic spacing between adjacent structures in the group of structures, and wherein each group of structures is separated from an adjacent group of structures by a second characteristic spacing, wherein the second characteristic spacing is at least 1.5 times larger than the first characteristic spacing; and a semiconductor layer grown directly on the substrate.

A third aspect of the invention provides a method of fabricating a semiconductor structure, the method comprising: forming a first plurality of structures formed on a growth surface of a substrate, wherein the first plurality of structures are formed in a multi-periodic pattern, the multi-periodic pattern including a first plurality of groups of structures, wherein each group of structures has a first characteristic spacing between adjacent structures in the group of structures, and wherein each group of structures is separated from an adjacent group of structures by a second characteristic spacing, wherein the second characteristic spacing is at least 1.5 times larger than the first characteristic spacing; and growing a semiconductor layer directly on the substrate.

The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

FIGS. 2A and 2C show illustrative top views of a multi-period patterned substrate, while

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

As indicated above, aspects of the invention provide a method of fabricating a semiconductor structure with a patterned substrate for improved growth of a semiconductor layer. The pattern on the patterned substrate is multi-periodic. To this extent, the pattern can include a first period with relatively closely spaced structures, which is embedded within a larger second period which can create larger spacing than that of the first period. While two periods are shown and described to illustrate the invention, it is understood that embodiments can include any number of two or more periods.

Figure 1A:
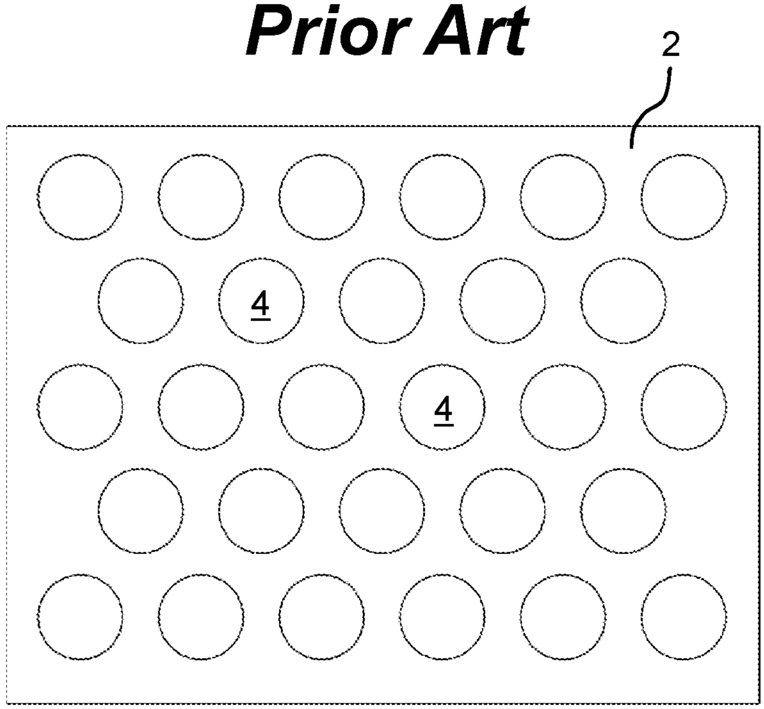
FIG. 1A Prior Art
FIGS. 1A and 1B show top and side views, respectively, including an illustrative patterned substrate according to the prior art.
Figure 1B:
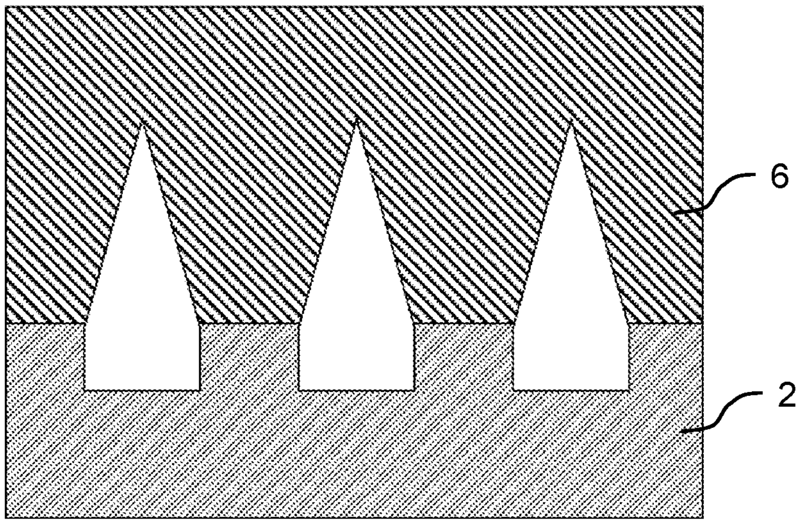
FIG. 1B Prior Art
Figure 2A:
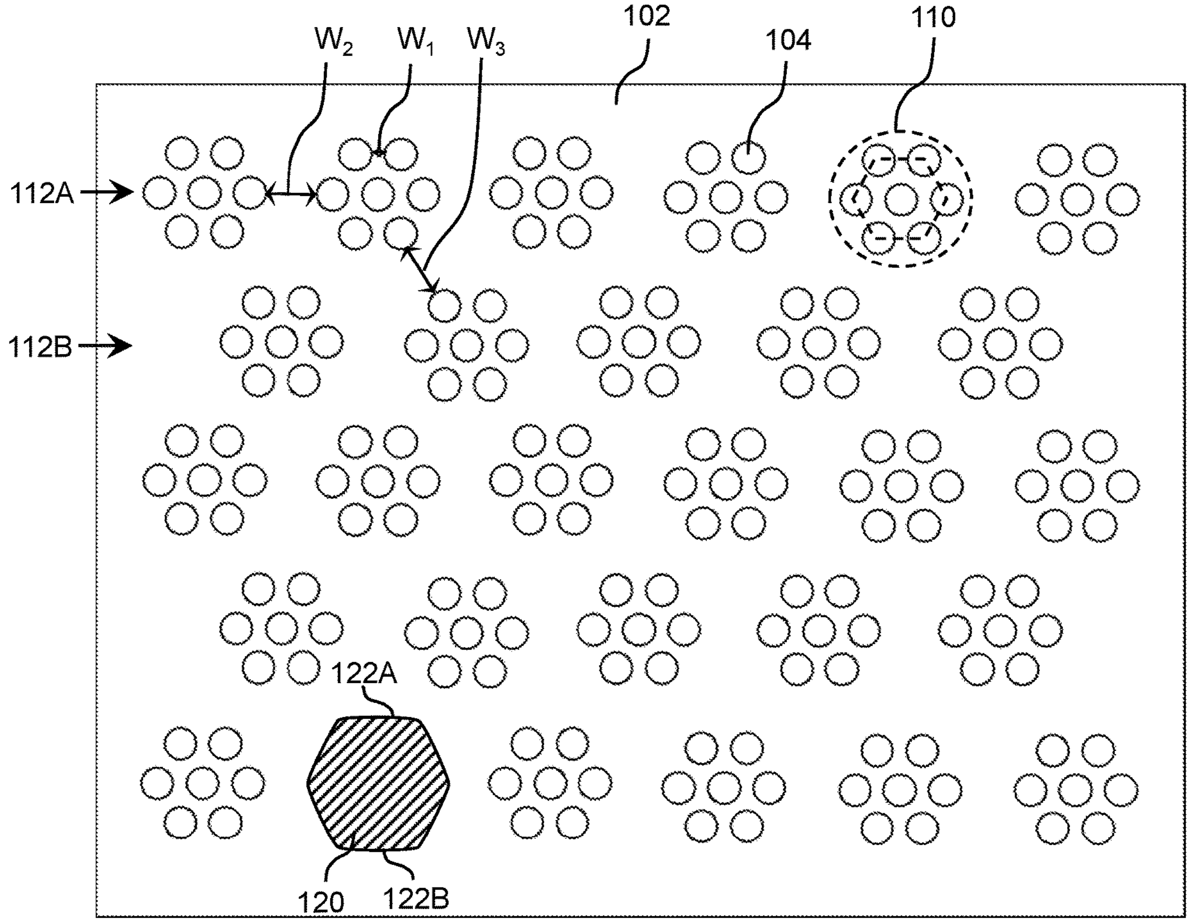

FIG. 2A shows a top view of an illustrative patterned substrate 102 according to an embodiment. In particular, the surface of the substrate 102 illustrated can correspond to the growth surface, on which group III-V semiconductor material is to be grown, e.g., to fabricate an optoelectronic semiconductor device. In an embodiment, the substrate 102 is formed of sapphire, but it is understood that the substrate 102 can be formed of any suitable substrate material for subsequent growth of group III-V semiconductor material thereon. Additional illustrative substrate 102 materials include silicon carbide (SiC), silicon (Si), bulk GaN, bulk AlN, bulk or a film of AlGaN, bulk or a film of BN, AlON, $LiGaO_2$, $LiAlO_2$, aluminum oxinitride ($AlO_xN_y$), $MgAl_2O_4$, GaAs, Ge, etc. Embodiments of the substrate 102 can include one or multiple layers of material.

The patterned substrate 102 includes a multi-periodic pattern of structures 104 as represented by the circles, which are formed on a growth surface of the substrate 102. In particular, each structure 104 can correspond to a pillar around which the substrate 102 has been removed. Alternatively, each structure 104 can correspond to a hole, which is formed into the surface of the substrate 102. Each structure 104 can have any height or depth as measured in a direction normal to the growth surface of the substrate 102. In embodiments, the height/depth of each structure 102 is approximately the same. However, it is understood that this need not be the case, and a patterned substrate 102 can have structures of varying heights/depths. In general, a minimum height/depth can be selected to prevent undesired growth at the bottom surface(s) of the pattern from interacting with the desired growth at the top surface(s) of the pattern. Any maximum height/depth used can be selected so as to not significantly affect structural integrity of the pattern. In embodiments, the height/depth of a pattern can be in a range between 0.05 to 100 microns, and in a more particular embodiment, between 0.5 and 10 microns.

Substrate material can be removed to form structures 104 of a desired height/depth using any solution. In an embodiment, the structures 104 can be formed using photolithography and wet chemical etching. However, it is understood that other types of lithography, such as e-beam, stepper, etc., can be utilized. Similarly, it is understood that other types of etching, such as dry etching, etc., can be utilized.

Regardless, it is understood that a circular cross-sectional (as measured in a direction parallel to the growth surface of the substrate 102) shape is only illustrative of various possible cross-sectional shapes for the structures 104. To this extent, in embodiments, structures 104 can have one or more of various regular or irregular geometric cross-sectional shapes, including triangular, rectangular, pentagonal, hexagonal, etc., elliptical, a multi-point star, etc. Furthermore, the cross-sectional shape of a structure 104 can be symmetric or asymmetric. Additionally, it is understood that while each structure 104 is shown having a substantially similar lateral width (e.g., diameter), this need not be the case and a multi-periodic pattern can include structures 104 having varying lateral widths.

In the embodiment shown in FIG. 2A, the structures 104 are formed in a multi-periodic pattern. In particular, the structures 104 have a first periodic pattern in which multiple structures 104 are clustered in groups 110 of structures 104. In the illustrated embodiment, each group 110 is shown including seven structures 104 arranged in offset rows of two, three, and two structures. Such an arrangement can be described as a circular arrangement in which six structures 104 surround a central structure 104 of the group 110 with the centers of the six structures 104 located around the central structure 104 at increments of approximately sixty degrees, approximately equidistant from the center of the central structure 104. Similarly, the arrangement of the group 110 can be described as a hexagonal arrangement with six structures 104 located at each vertex of a hexagon and a seventh structure 104 centrally located within the hexagon.

In an embodiment, each group 110 occupies substantially the same amount of surface area of the substrate 102. Furthermore, while not shown, it is understood that the surface of the substrate 102 can include one or more partial groups of structures 104. For example, at the outer edges of the substrate 102, one or more partial groups of structures 104 can be included. Each partial group of structures 104 can have one or more structures 104 and/or one or more structures 104 of a different size and/or shape than the structures 104 included in most groups 110.

Similarly, while each group 110 is shown having the same arrangement of structures 104, it is understood that an embodiment of the multi-periodic pattern can include groups 110 with different arrangements of structures 104. Such arrangements can differ in the number and/or size of the structures 104 included in the group 110. For example, different groups 110 can be utilized in a central portion of the substrate 102 than on the outer portions of the substrate 102. However, it is understood that this configuration is only illustrative of various possible configurations with different arrangements of structures 104.

Each group 110 includes a characteristic spacing $W_1$ between immediately adjacent structures 104 within the corresponding group 110. As used herein, the characteristic spacing $W_1$ for a group 110 can be determined as an average minimum spacing between an outer edge of each structure 104 in a group 110 and an outer edge of each of the adjacent structure(s) 104. In the group 110 shown in FIG. 2A, each outer structure 104 has three immediately adjacent structures 104, while the central structure 104 has six immediately adjacent structures 104. The characteristic spacing $W_1$ can be determined by calculating an average of the spacing between these immediately adjacent structures 104.

In general, a smaller initial growing area (e.g., features relatively small lateral widths and with wide characteristic spacing) can be preferred in order to maximize areas undergoing lateral growth. However, areas that are too small can be difficult to produce and spacing that is too wide can take too long to coalesce. Furthermore, the feature sizes can affect light transmission through the interface, which can vary based on the wavelength of the light. As a result, each of these implementation-dependent factors can be considered when forming the structures. In an embodiment, the structures in a group 110 have lateral widths (e.g., as measured by the largest lateral diameter) and a characteristic spacing $W_1$ that are within a factor of three of each other, e.g., in a range between 0.05 microns and 100 microns.

The groups 110 are shown arranged on the substrate 102 in a second, larger periodic pattern. The larger periodic pattern can be described as a series of rows 112A, 112B, with each row offset from the immediately adjacent rows 112A, 112B. In the illustrative embodiment, the periodic pattern includes pairs of rows 112A, 112B that are repeated over the surface of the substrate 102. However, it is understood that a pattern can include any number of rows prior to repeating. While each row 112A, 112B is shown including a certain number of groups 110, it is understood that this is only illustrative and any number of groups 110 can be included in a row to cover a substrate 102.

Similarly, the groups 110 in the larger periodic pattern are offset such that the groups in a row 112A-112B are approximately centered on a spacing $W_2$ between immediately adjacent groups in the immediately adjacent row(s). However, it is understood that such an offset is only illustrative, and any offset, including no offset, can be used in the larger periodic pattern. While the groups 110 are illustrated as being closest at the vertexes of the hexagonal arrangements, it is understood that such a configuration is only illustrative. For example, in an embodiment the hexagonal arrangements are rotated (e.g., by thirty degrees) such that the groups 110 are closest together at a location between the vertices of a side of the hexagonal arrangement. In an embodiment, the larger pattern can include multiple rotations of the hexagonal arrangements.

The larger periodic pattern includes a first characteristic spacing $W_2$ between immediately adjacent groups 110 in the rows 112A, 112B. As used herein, the first characteristic spacing $W_2$ for the larger periodic pattern can be determined as an average minimum spacing between outer edges of the closest structures 104 in immediately adjacent groups 110 in a row 112A, 112B. In the rows 112A, 112B shown in FIG. 2A, each group 110 has one or two immediately adjacent groups 110 in the row 112A, 112B. The characteristic spacing $W_2$ can be determined by calculating an average of the spacing between these immediately adjacent groups 110.

Additionally, the larger periodic pattern includes a second characteristic spacing $W_3$ between immediately adjacent groups 110 in adjacent rows 112A, 112B. As used herein, the second characteristic spacing $W_3$ for the larger periodic pattern can be determined as an average minimum spacing between outer edges of the closest structures 104 in the immediately adjacent groups 110 in adjacent rows 112A, 112B. In the rows 112A, 112B shown in FIG. 2A, each group 110 has one, two, or four immediately adjacent groups 110 in the adjacent row(s) 112A, 112B. The characteristic spacing $W_3$ can be determined by calculating an average of the spacing between these immediately adjacent groups 110.

In an embodiment, the characteristic spacings $W_2$, $W_3$ for the larger periodic pattern are similar to each other. In a more particular embodiment, the characteristic spacings $W_2$, $W_3$ for the larger periodic pattern are approximately the same. Similar to the lateral widths and characteristic spacing within the groups, the characteristic spacings $W_2$, $W_3$ between groups can be selected based on similar considerations. To this extent, the characteristic spacings $W_2$, $W_3$ can be in a range between 0.05 microns and 100 microns. However, as discussed herein, the characteristic spacings between groups can be larger than that within groups. In an embodiment, the characteristic spacings $W_2$, $W_3$ are between 1.5 and 10 times the characteristic spacing $W_1$ within the groups.

As illustrated, each of the characteristic spacings $W_2$, $W_3$ for the larger periodic pattern can be larger than the characteristic spacing $W_1$ for the groups 110. As a result, the multi-periodic pattern creates regions with smaller spacing separated by wider spacing. In this manner, the multi-periodic pattern can incorporate advantages of the selections of both smaller and larger spacings.

During growth of a layer on the multi-period patterned substrate 102, the material grown on each group 110 shown in FIG. 2A will first coalesce into a hexagonally shaped structure 120. In embodiments, the structures 120 have a characteristic lateral width (e.g., as measured by an average maximum lateral width of the structures 120 at coalescence of the structures 104 in the corresponding group 110) that is within a factor of three of the characteristic spacings $W_2$, $W_3$. In an embodiment, the structures 104 forming each group 110 are arranged such that the corresponding structure 120 includes at least one side having a desired orientation with respect to a predetermined crystal plane of the corresponding substrate material.

Figure 2B:
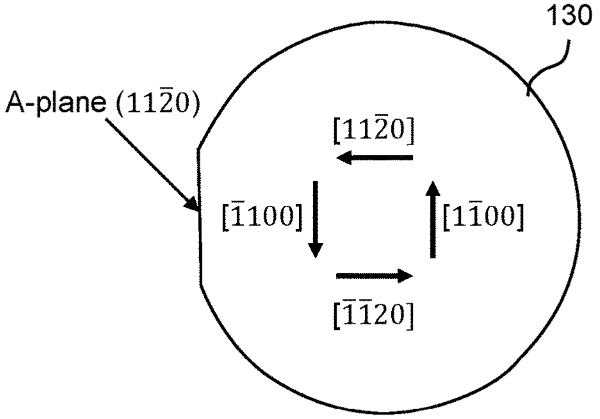
FIG. 2B shows illustrative crystal planes for a corresponding wafer according to embodiments.

For example, FIG. 2B shows an illustrative wafer 130 and the corresponding crystal planes according to an embodiment. In an embodiment, the wafer 130 can comprise sapphire, although any type of wafer material and corresponding planes can be used. The wafer 130 can comprise a growth surface which comprises a multi-period patterned substrate as described herein. In this case, as a layer of material, such as a group III nitride material, is grown on the groups 110 and coalesces into a structure 120, the structure 120 can include two sides 122A, 122B, which are aligned perpendicular with the A-plane $(11\bar{2}0)$ of the sapphire wafer 130.

Figure 2C:
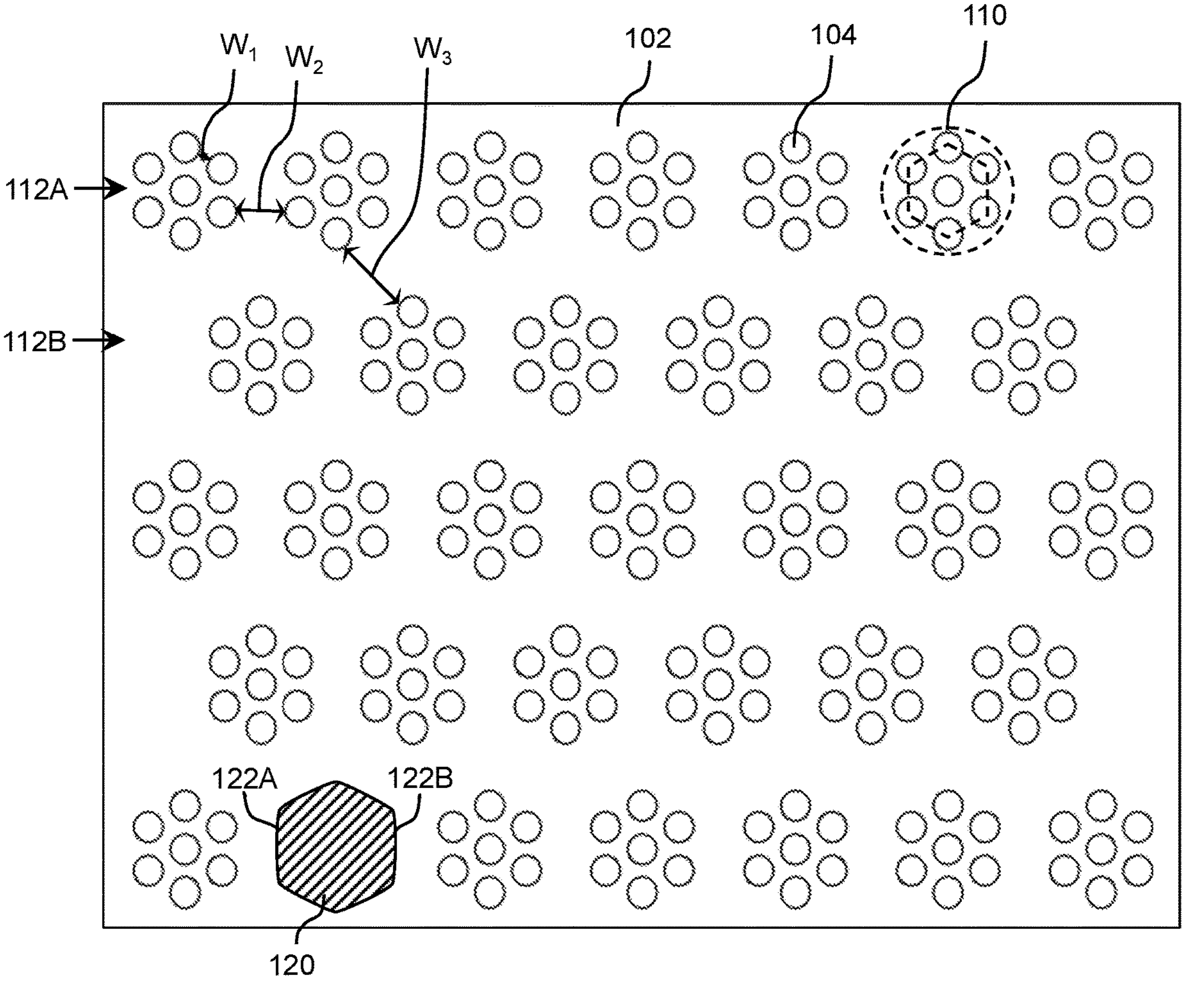

FIG. 2C shows an illustrative top view of another multi-period patterned substrate 102 according to an embodiment. The multi-period patterned substrate 102 also can be formed on the growth surface of the wafer 130 shown in FIG. 2B. In this case, the structures 104 forming each group 110 have been rotated 90 degrees, thereby causing the resulting structure 120 to include two sides 122A, 122B that are aligned parallel with the A-plane of the wafer 130.

Alignment in this manner can further reduce a number of dislocations propagating into the upper layers of the device. While perpendicular and parallel alignments with the A-plane have been illustrated, it is understood that perpendicular and/or parallel alignment with another plane, such as the M-plane can be implemented. The group III nitride material can comprise any group III nitride material. While a sapphire substrate is illustrated, it is understood that any suitable substrate can be used for subsequent growth of group III nitride materials thereon. Furthermore, while group patterns resulting in hexagonal coalesced structures 120 are shown, it is understood that coalesced structures 120 having any shape can be used.

In other embodiments, coalesced structures 120 can be configured to have a mix of parallel and perpendicular alignments and/or a mix of alignments with respect to different planes. For example, a pattern can include a mix of the groups 110 shown in FIGS. 2A and 2C, e.g., with a group rotated 90 degrees compared to its neighboring groups in a row 112A, 112B, alternating rows 112A, 112B with groups 110 of different alignments, regions of the substrate 102 with groups 110 having different alignments, and/or the like.

Figure 3:
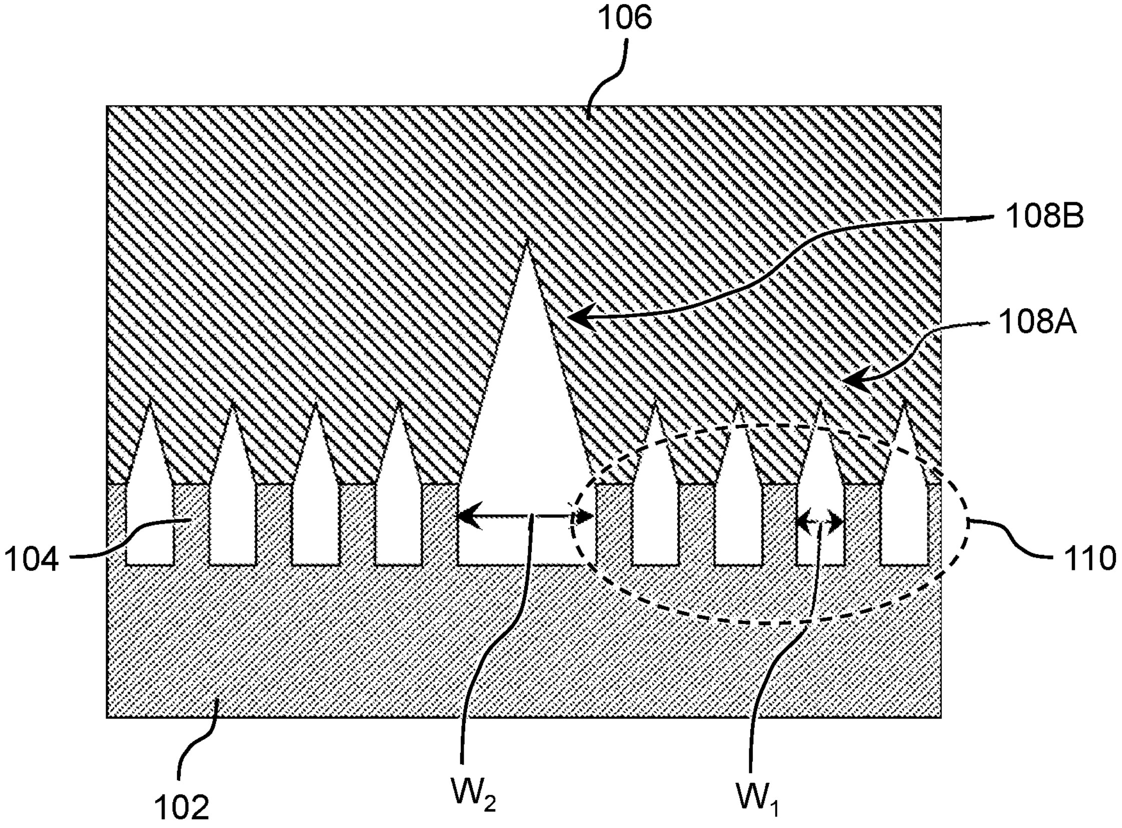
FIG. 3 shows an illustrative cross-sectional view of a multi-period patterned substrate and a layer grown thereon according to an embodiment.

FIG. 3 shows an illustrative cross-sectional view of a multi-period patterned substrate 102 and a layer 106 grown thereon according to an embodiment. As illustrated in FIG. 3, the substrate 102 includes structures 104 (in this case pillars) arranged in a multi-period pattern, which results in differing characteristic spacings $W_2$ between structures 104. In an embodiment, the semiconductor layer 106 comprises a group III-nitride layer, such as AlN, AlGaN, AlGaBN, AlInN, AlGaInN, AlGaInBN, and/or the like, which is grown directly on the patterned substrate 102. In an embodiment, a thickness of the semiconductor layer 106 is between approximately 100 nanometers and approximately 10 micrometers.

As further shown, during growth, the layer 106 coalesces in a multi-periodic pattern. For example, regions 108A of the layer 106 above the smaller spacings $W_1$ coalesce much sooner than regions 108B located above the larger spacings $W_2$, thereby forming multiple structures 120 along a first height of the layer 106. The lower portions of the regions 108B of the layer 106 grown over the larger spacings $W_2$ will be dominated by lateral growth, and therefore can have fewer dislocations. The lower portions of the regions 108A of the layer 106 will have a mix of lateral and vertical growth, which can reduce the dislocations, while providing an interface more conducive for the passage of radiation therethrough.

In embodiments, the layer 106 is grown to a thickness sufficient for all of the semiconductor material to coalesce around the regions 108A, 108B. To this extent, the layer 106 can coalesce into a planar film on a top surface thereof. For example, as illustrated in FIG. 2C, growth of the semiconductor layer 106 can result in each group of structures 110 forming a (e.g., hexagonal) coalesced structure 120. Continued growth of the semiconductor layer 106 can result in the material forming the coalesced structures 120 subsequently coalescing, forming a substantially contiguous layer.

The semiconductor layer 106 can be grown using any solution. In an embodiment, the semiconductor layer 106 is grown directly on the patterned substrate 102 using an epitaxial process, which favors lateral growth of the semiconductor layer 106. In an embodiment, the epitaxial process includes a material deposition process, such as metal organic chemical vapor deposition (MOCVD), molecular beam epitaxy (MBE), hydride vapor phase epitaxy (HYPE), a modified version of any of MOCVD, MBE, or HYPE, etc.

Furthermore, embodiments of the epitaxial process can be performed at: a temperature between approximately 400 degrees Celsius and approximately 1500 degrees Celsius; a pressure between approximately $1\times10^{-5}$ Torr and approximately 1000 Torr; and/or the like. In a more particular embodiment, the temperature is between approximately 1000 degrees Celsius and approximately 1300 degrees Celsius and the pressure is between approximately 20 Torr and approximately 400 Torr, and each can vary during the epitaxial process. Additionally, the epitaxial process can use a flux ratio between ammonia and the group III elements in the growth chamber between approximately 1 and 10000. In a more particular embodiment, the flux ratio is between approximately 250-5000, and can vary during the epitaxial process.

In embodiments, growth of the layer 106 can include one or more additional steps, which can be configured to further reduce dislocations in the layer 106, such as dislocations generated at the coalescence boundaries. For example, after growth of the layer 106 causes coalescence of a group of structures into a larger structure, the layer 106 can be annealed. The annealing can be performed at a high temperature, e.g., between approximately 1300 Celsius and approximately 1800 Celsius. The annealing can last for a duration of 30 minutes to 30 hours, and more particularly for a duration between 1 hour and 6 hours. The annealing can be performed in a nitrogen or argon ambient environment with a pressure ranging between 0.1 atmospheres to 10 atmospheres. Such annealing can be performed, for example, after formation of the structures 120, after the entire layer coalesces, and/or after formation of any intermediate structures, such as when the patterned substrate includes more than two periods with different lateral spacing and/or lateral widths.

It is understood that the multi-period pattern arrangement shown in FIGS. 2A and 2C is only illustrative of various possible multi-period pattern arrangements which can be implemented according to embodiments. To this extent, FIGS. 4A-4C show illustrative top views of multi-period patterned substrates according to embodiments.

Figure 4A:
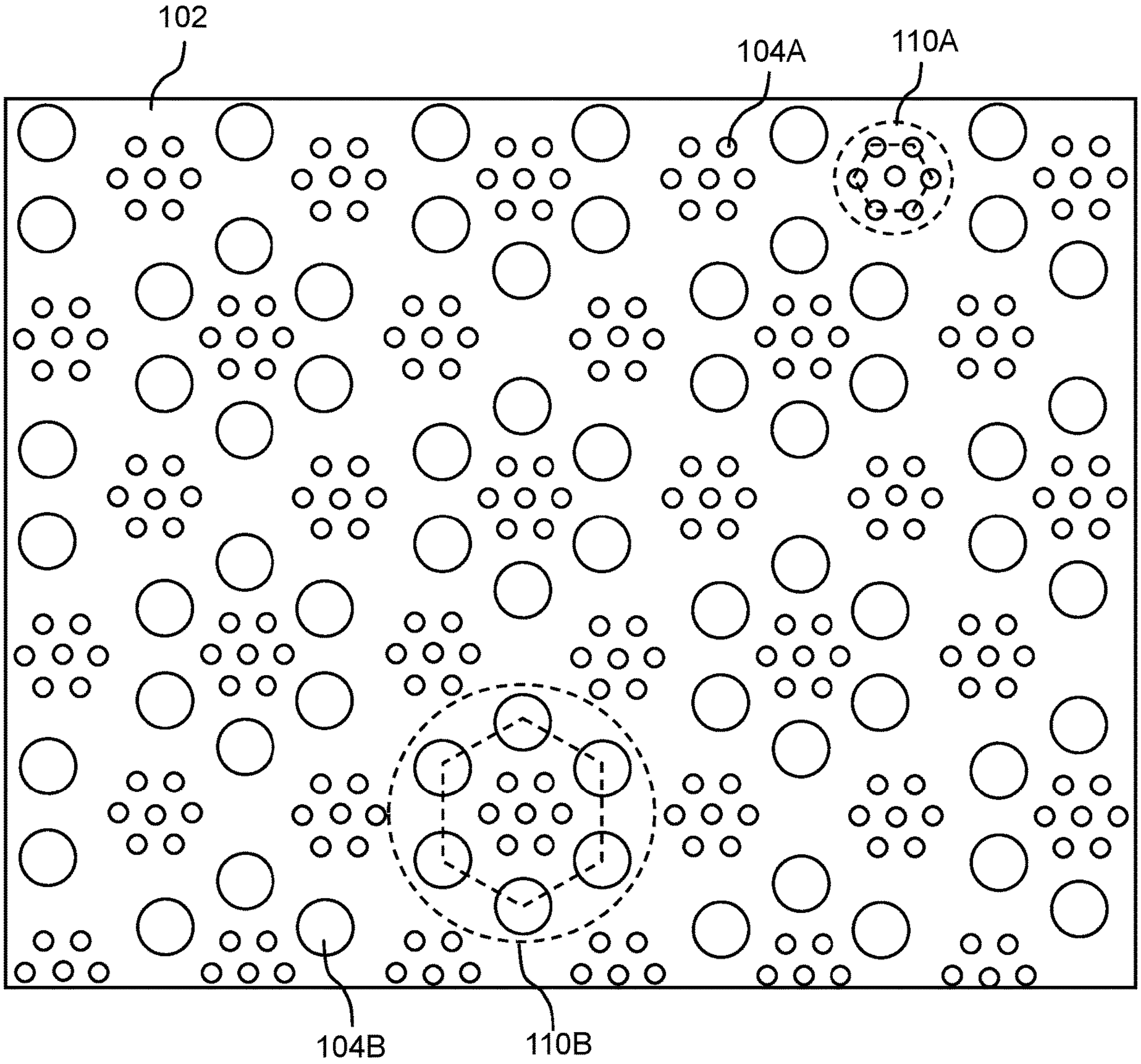
FIGS. 4A-4C show illustrative top views of multi-period patterned substrates according to embodiments.
Figure 4B:
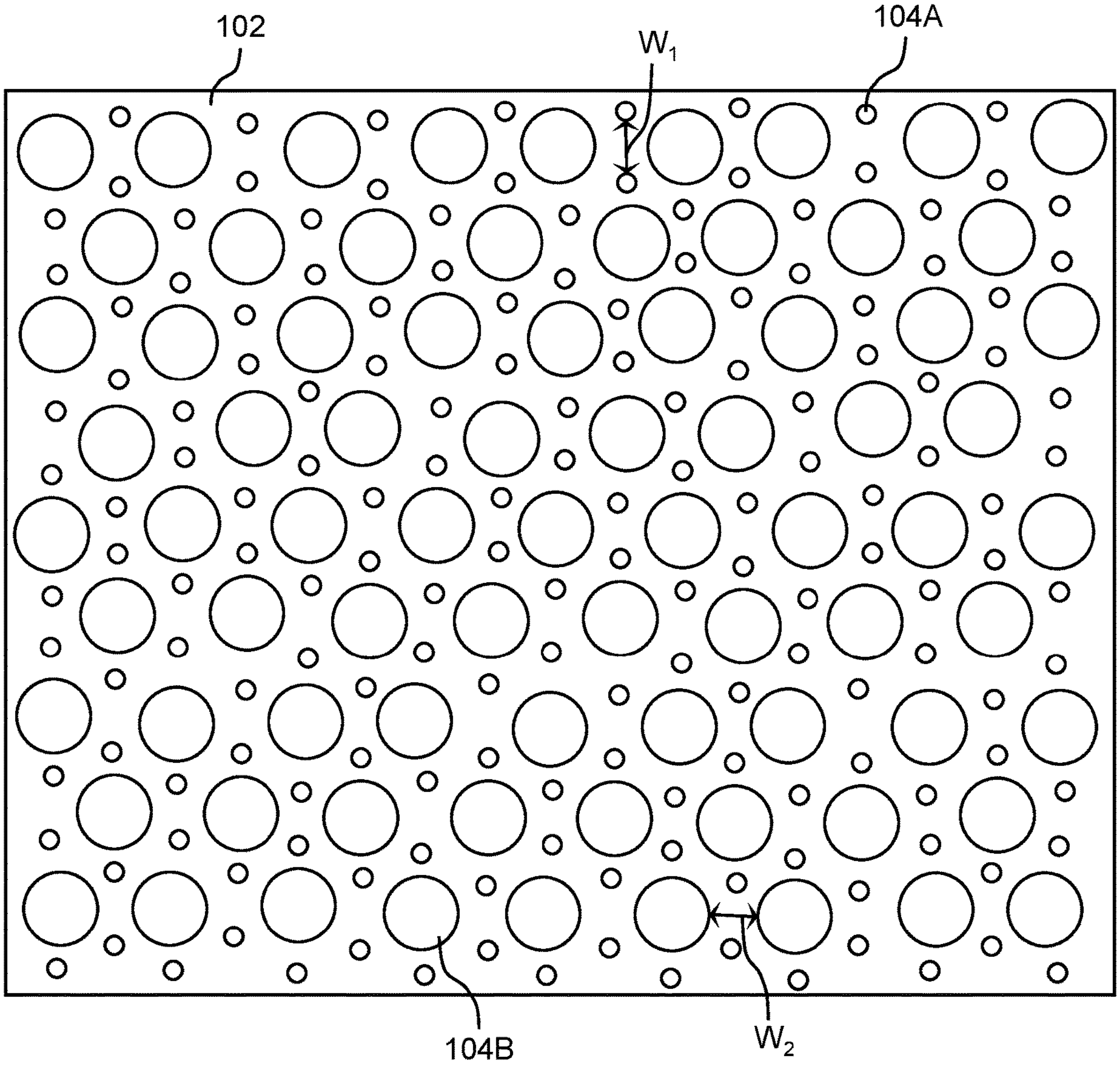
Figure 4C:
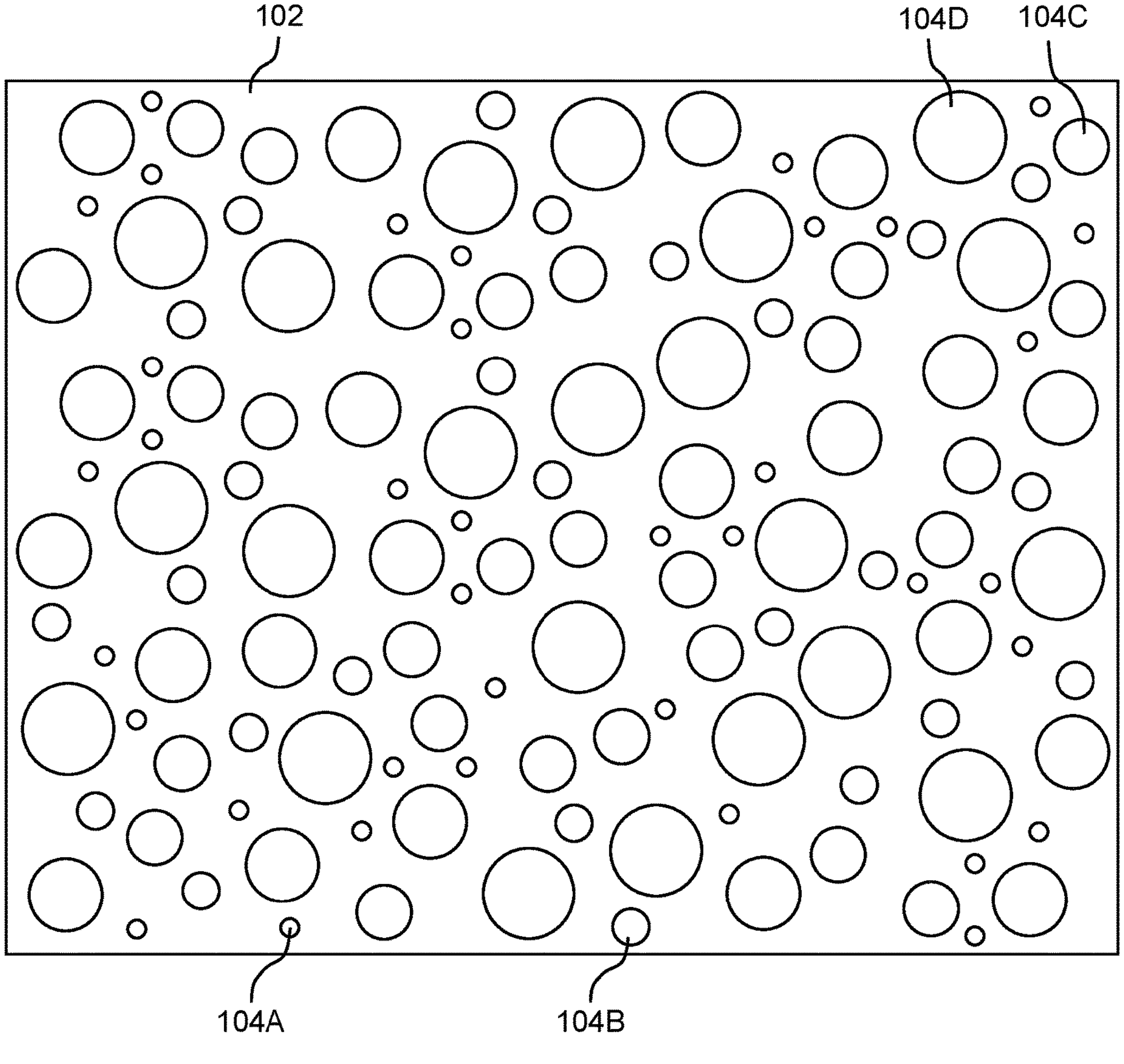

In FIG. 4A, the patterned substrate 102 includes a first multi-periodic pattern of structures 104A clustered in groups 110A, which is embedded within a second multi-periodic pattern of structures 1046 clustered in groups 1106. As illustrated, the structures 104B forming the second multi-periodic pattern can be larger than the structures 104A forming the first multi-periodic pattern. However, it is understood that this need not be the case and embodiments of the second multi-periodic pattern of structures 1046 can include additional structures rather than larger structures, which define a larger size for each of the corresponding groups 1106.

Embodiments of the groups 110A, 1106 can have any orientation with respect to a predetermined crystal plane of the corresponding substrate material. As illustrated, one set of groups, such as the groups 110A, can include two sides aligned perpendicular with the A-plane ($11\bar{2}0$) of the corresponding wafer. Furthermore, the other set of groups, such as the groups 1106, can be rotated by 90 degrees, thereby including two sides aligned parallel with the A-plane of the corresponding wafer. However, it is understood that this is only illustrative, and a substrate 102 can include groups 110A, 110B having different orientations from other groups 110A, 110B of the same type.

In embodiments, the lateral widths and characteristic spacings of the structures 104A and corresponding groups of structures 110A can be within a factor of three of each other. In more particular embodiments the lateral widths and characteristic spacings can be similar to each other. Additionally, the lateral widths and characteristic spacings of the structures 104B and corresponding groups of structures 110B also can be within a factor of three of each other, and more particularly, similar to each other. In embodiments, the respective characteristic spacings, $W_1$, within the respective groups of structures 110A, 110B differ by a factor of between 1.5 and 10 times. Similarly, respective characteristic spacings, $W_2$ and $W_3$, between adjacent groups of similar structures 110A, 110B also can differ by a factor of between 1.5 and 10 times. However, it is understood that this configuration is only illustrative, and one or more of the respective characteristic spacings $W_1$, $W_2$, $W_3$ can be similar for the different groups of structures 110A, 110B.

FIG. 4B shows another illustrative patterned substrate 102, which includes first structures 104A of a first size interspersed with second structures 104B of a second size. In embodiments, the second structures 104B are spaced in a pattern having a second characteristic spacing $W_2$ between adjacent second structures 104B, with the smaller first structures 104A located within the spacing and having a first characteristic spacing $W_1$ between adjacent first structures 104A. In embodiments, a characteristic lateral size of the second structures 104B is similar to the second characteristic spacing $W_2$. In embodiments, the characteristic lateral size of the second structures 1046 is approximately 1.5 to 10 times the characteristic lateral size of the first structures 104A. In embodiments, the first characteristic spacing $W_1$ is similar to the second characteristic spacing $W_2$.

In this embodiment, the respective structures 104A, 104B can provide different periods for coalescence during the growth of a layer thereon. When the structures 104A, 104B comprise holes, growth of a layer on the patterned substrate 102 can result in coalescence at multi-periodic heights. For example, regions of the layer located above the structures 1046 will coalesce much higher in the layer than the regions located above the structures 104A. When the structures 104A, 104B comprise pillars on which the layer is grown, regions above the structures 104B can have a mix of lateral and vertical growth, which can reduce dislocations, while providing an interface more conducive for the passage of radiation therethrough, while the remaining regions will be dominated by lateral growth before coalescence, which can reduce dislocations.

FIG. 4C shows another illustrative patterned substrate 102, which includes structures 104A-104D of varying lateral sizes having an irregular arrangement. In embodiments, the lateral sizes can include various sizes of structures in which the largest structures 104D are approximately 10 times larger than the smallest structures 104A. The arrangement can include similar numbers of structures 104A-104D across the different sizes. In embodiments, the arrangement can be configured such that a maximum lateral size of area of the patterned substrate 102 that does not include a structure 104A-104D is less than 1.5 times the lateral size of the largest structures 104D.

Similar to the embodiment of FIG. 4B, the structures 104A-104D can provide different periods for coalescence during the growth of a layer thereon. In this case, the various heights at which the layer coalesces can be irregularly distributed across the growth surface of the substrate 102.

The additional flexibility provided by use of a multi-period pattern arrangement of structures 104 on the substrate 102 can, for example, enable improvements in quality of the semiconductor layer(s) grown thereon, provide further control over stress and strain in the semiconductor layer(s), provide improved and/or additional control over radiation passing through the substrate 102/semiconductor 106 interface, and/or the like.

Fabrication of a device can continue with any combination of various layers grown above the layer 106. For example, in an embodiment, the layer 106 comprises a buffer layer configured to provide a transition between the substrate 102 and the active layers of a device, which are subsequently formed on the layer 106. As used herein, the active layers of a device affect the electronic operation of the device. An illustrative stack of active layers can include one or more n-type layers, followed by an active region, followed by one or more p-type layers. However, it is understood that this arrangement is only illustrative of various possible layer arrangements. To this extent, in embodiments, a device can be fabricated with layer 106 being an active layer.

Figure 5:
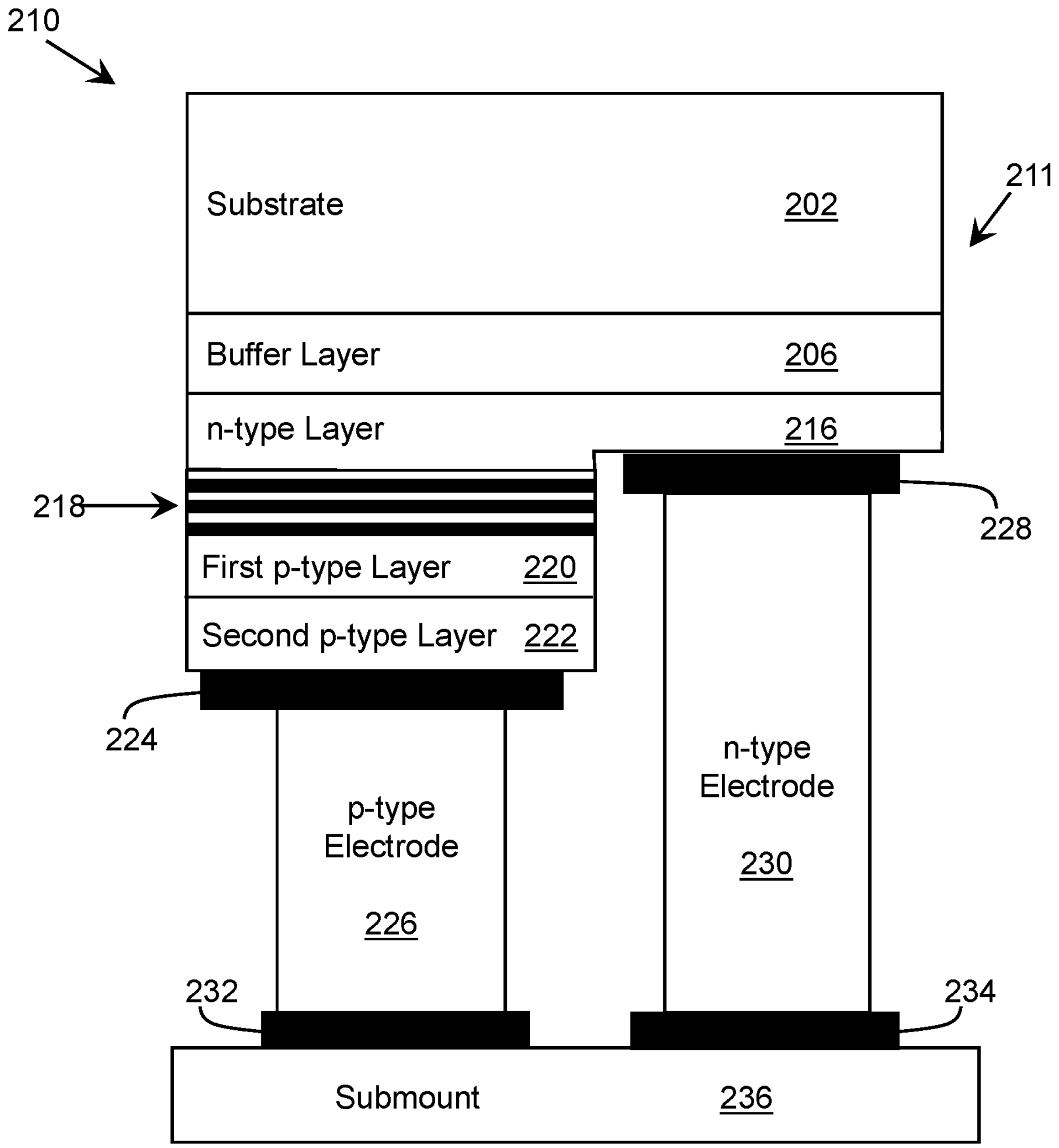
FIG. 5 shows a schematic structure of an illustrative optoelectronic device according to an embodiment.

An illustrative device can comprise a flip-chip optoelectronic device. FIG. 5 shows a schematic structure of an illustrative flip-chip optoelectronic device 210 according to an embodiment. In a more particular embodiment, the optoelectronic device 210 is configured to operate as an emitting device, such as a light emitting diode (LED) or a laser diode (LD). In either case, during operation of the optoelectronic device 210, application of a bias comparable to the band gap results in the emission of electromagnetic radiation from an active region 218 of the optoelectronic device 210. A significant portion of the radiation can be emitted through the substrate 202. Alternatively, the optoelectronic device 210 can operate as a sensing device, such as a photodiode. In this case, a significant portion of the radiation sensed by the optoelectronic device 210 can pass through the substrate 202 to the active region 218.

The electromagnetic radiation emitted (or sensed) by the optoelectronic device 210 can have a peak wavelength within any range of wavelengths, including visible light, ultraviolet radiation, deep ultraviolet radiation, infrared light, and/or the like. In an embodiment, the device 210 is configured to emit (or sense) radiation having a dominant wavelength within the ultraviolet range of wavelengths. In a more specific embodiment, the dominant wavelength is within a range of wavelengths between approximately 210 and approximately 360 nanometers.

The optoelectronic device 210 includes a heterostructure 211 comprising a substrate 202, a buffer layer 206 adjacent to the substrate 202, and a plurality of active layers adjacent to the buffer layer 206. The active layers can include an n-type layer 216 (e.g., a cladding layer, electron supply layer, contact layer, and/or the like) adjacent to the buffer layer 206, and an active region 218 having an n-type side adjacent to the n-type layer 216. Furthermore, the active layers of the heterostructure 211 of the optoelectronic device 210 include a first p-type layer 220 (e.g., an electron blocking layer, a cladding layer, hole supply layer, and/or the like) adjacent to a p-type side of the active region 218 and a second p-type layer 222 (e.g., a cladding layer, hole supply layer, contact layer, and/or the like) adjacent to the first p-type layer 220.

In a more particular illustrative embodiment, the optoelectronic device 210 is a group III-V materials based device, in which some or all of the various layers are formed of elements selected from the group III-V materials system. In a still more particular illustrative embodiment, the various layers of the optoelectronic device 210 are formed of group III nitride based materials. Group III nitride materials comprise one or more group III elements (e.g., boron (B), aluminum (Al), gallium (Ga), and indium (In)) and nitrogen (N), such that $Al_xGa_yIn_zB_{1-x-y-z}N$, where x, y, and z indicate the molar fraction of a given element, $0 \leq x, y, z \leq 1$, and $0 \leq x+y+z \leq 1$. Illustrative group III nitride materials include binary, ternary and quaternary alloys such as, AlN, GaN, InN, BN, AlGaN, AlInN, AlBN, AlGaInN, AlGaBN, AlInBN, and AlGaInBN with any molar fraction of group III elements.

An illustrative embodiment of a group III nitride based optoelectronic device 210 includes an active region 218 (e.g., a series of alternating quantum wells and barriers) composed of $In_yAl_xGa_{1-x-y}N$, $Ga_zIn_yAl_xB_{1-x-y-z}N$, an $Al_xGa_{1-x}N$ semiconductor alloy, or the like. Similarly, the n-type layer 216, the first p-type layer 220, and the second p-type layer 222 can be composed of an $In_yAl_xGa_{1-x-y}N$ alloy, a $Ga_zIn_yAl_xB_{1-x-y-z}N$ alloy, or the like. The molar fractions given by x, y, and z can vary between the various layers 216, 218, 220, and 222.

When the optoelectronic device 210 is configured to be operated in a flip-chip configuration as shown, the substrate 202 and buffer layer 206 can be transparent to the target electromagnetic radiation. To this extent, an embodiment of the substrate 202 is formed of sapphire, and the buffer layer 206 can be composed of AlN, an AlGaN/AlN superlattice, and/or the like. However, it is understood that the substrate 202 can be formed of any suitable material including, for example, silicon carbide (SiC), silicon (Si), bulk GaN, bulk AlN, bulk or a film of AlGaN, bulk or a film of BN, AlON, $LiGaO_2$, $LiAlO_2$, aluminum oxinitride ($AlO_xN_y$), $MgAl_2O_4$, GaAs, Ge, or another suitable material. To this extent, embodiments of the optoelectronic device 210 can have some or all of the substrate 202 and/or buffer layer 206 removed.

The optoelectronic device 210 can further include a p-type contact 224, which can form an ohmic contact to the second p-type layer 222, and a p-type electrode 226 can be attached to the p-type contact 224. Similarly, the optoelectronic device 210 can include an n-type contact 228, which can form an ohmic contact to the n-type layer 216, and an n-type electrode 230 can be attached to the n-type contact 228. The p-type contact 224 and the n-type contact 228 can form ohmic contacts to the corresponding layers 222, 216, respectively.

In an embodiment, the p-type contact 224 and the n-type contact 228 each comprise several conductive and reflective metal layers, while the n-type electrode 230 and the p-type electrode 226 each comprise highly conductive metal. In an embodiment, the second p-type layer 222 and/or the p-type electrode 226 can be transparent to the electromagnetic radiation generated by the active region 218. For example, the second p-type layer 222 and/or the p-type electrode 226 can comprise a short period superlattice lattice structure, such as an at least partially transparent magnesium (Mg)-doped AlGaN/AlGaN short period superlattice structure (SPSL). Furthermore, the p-type electrode 226 and/or the n-type electrode 230 can be reflective of the electromagnetic radiation generated by the active region 218. In another embodiment, the n-type layer 216 and/or the n-type electrode 230 can be formed of a short period superlattice, such as an AlGaN SPSL, which is transparent to the electromagnetic radiation generated by the active region 218.

As further shown with respect to the optoelectronic device 210, the device 210 can be mounted to a submount 236 via the electrodes 226, 230 in a flip chip configuration. In this case, the substrate 202 is located on the top of the optoelectronic device 210. To this extent, the p-type electrode 226 and the n-type electrode 230 can both be attached to a submount 236 via contact pads 232, 234, respectively. The submount 236 can be formed of aluminum nitride (AlN), silicon carbide (SiC), and/or the like.

Any of the various layers of the optoelectronic device 210 can comprise a substantially uniform composition or a graded composition. For example, a layer can comprise a graded composition at a heterointerface with another layer. In an embodiment, the p-type layer 220 comprises a p-type blocking layer having a graded composition. The graded composition(s) can be included to, for example, reduce stress, improve carrier injection, and/or the like. Similarly, a layer can comprise a superlattice including a plurality of periods, which can be configured to reduce stress, and/or the like. In this case, the composition and/or width of each period can vary periodically or aperiodically from period to period.

It is understood that the layer and flip-chip configuration of the optoelectronic device 210 described herein is only illustrative. To this extent, an emitting device/heterostructure can include an alternative layer configuration, one or more additional layers, and/or the like. As a result, while the various layers are shown immediately adjacent to one another (e.g., contacting one another), it is understood that one or more intermediate layers can be present in an emitting device/heterostructure. For example, an illustrative emitting device/heterostructure can include an undoped layer between the active region 218 and one or both of the p-type cladding layer 222 and the n-type cladding layer 216.

Furthermore, an emitting device/heterostructure can include a Distributive Bragg Reflector (DBR) structure, which can be configured to reflect light of particular wavelength(s), such as those emitted by the active region 218, thereby enhancing the output power of the device/heterostructure. For example, the DBR structure can be located between the p-type cladding layer 222 and the active region 218. Similarly, a device/heterostructure can include a p-type layer located between the p-type cladding layer 222 and the active region 218. The DBR structure and/or the p-type layer can comprise any composition based on a desired wavelength of the light generated by the device/heterostructure. In one embodiment, the DBR structure comprises a Mg, Mn, Be, or Mg+Si-doped p-type composition. The p-type layer can comprise a p-type AlGaN, AlInGaN, and/or the like. It is understood that a device/heterostructure can include both the DBR structure and the p-type layer (which can be located between the DBR structure and the p-type cladding layer 222) or can include only one of the DBR structure or the p-type layer. In an embodiment, the p-type layer can be included in the device/heterostructure in place of an electron blocking layer. In another embodiment, the p-type layer can be included between the p-type cladding layer 222 and the electron blocking layer.

While illustrative aspects of the invention have been shown and described herein primarily in conjunction with a substrate structure for an optoelectronic device and a method of fabricating such a substrate structure and/or device, it is understood that aspects of the invention further provide various alternative embodiments.

Figure 6:
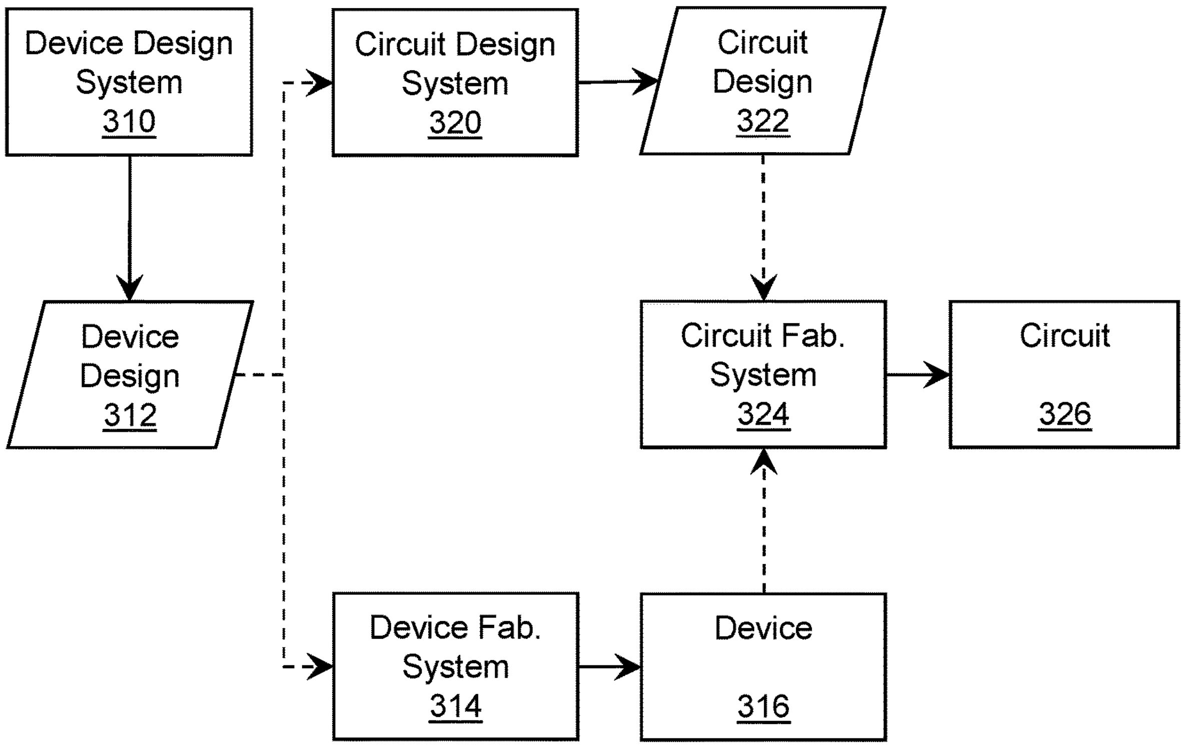
FIG. 6 shows an illustrative flow diagram for fabricating a circuit according to an embodiment.

In one embodiment, the invention provides a method of designing and/or fabricating a circuit that includes one or more of the devices designed and fabricated as described herein. To this extent, FIG. 6 shows an illustrative flow diagram for fabricating a circuit 326 according to an embodiment. Initially, a user can utilize a device design system 310 to generate a device design 312 for a semiconductor device as described herein. The device design 312 can comprise program code, which can be used by a device fabrication system 314 to generate a set of physical devices 316 according to the features defined by the device design 312. Similarly, the device design 312 can be provided to a circuit design system 320 (e.g., as an available component for use in circuits), which a user can utilize to generate a circuit design 322 (e.g., by connecting one or more inputs and outputs to various devices included in a circuit). The circuit design 322 can comprise program code that includes a device designed as described herein. In any event, the circuit design 322 and/or one or more physical devices 316 can be provided to a circuit fabrication system 324, which can generate a physical circuit 326 according to the circuit design 322. The physical circuit 326 can include one or more devices 316 designed as described herein.

In another embodiment, the invention provides a device design system 310 for designing and/or a device fabrication system 314 for fabricating a semiconductor device 316 as described herein. In this case, the system 310, 314 can comprise a general purpose computing device, which is programmed to implement a method of designing and/or fabricating the semiconductor device 316 as described herein. Similarly, an embodiment of the invention provides a circuit design system 320 for designing and/or a circuit fabrication system 324 for fabricating a circuit 326 that includes at least one device 316 designed and/or fabricated as described herein. In this case, the system 320, 324 can comprise a general purpose computing device, which is programmed to implement a method of designing and/or fabricating the circuit 326 including at least one semiconductor device 316 as described herein.

In still another embodiment, the invention provides a computer program fixed in at least one computer-readable medium, which when executed, enables a computer system to implement a method of designing and/or fabricating a semiconductor device as described herein. For example, the computer program can enable the device design system 310 to generate the device design 312 as described herein. To this extent, the computer-readable medium includes program code, which implements some or all of a process described herein when executed by the computer system. It is understood that the term "computer-readable medium" comprises one or more of any type of tangible medium of expression, now known or later developed, from which a stored copy of the program code can be perceived, reproduced, or otherwise communicated by a computing device.

In another embodiment, the invention provides a method of providing a copy of program code, which implements some or all of a process described herein when executed by a computer system. In this case, a computer system can process a copy of the program code to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a device design system 310 for designing and/or a device fabrication system 314 for fabricating a semiconductor device as described herein. In this case, a computer system can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; and/or the like.

As used herein, unless otherwise noted, the term "set" means one or more (i.e., at least one) and the phrase "any solution" means any now known or later developed solution. The singular forms "a," "an," and "the" include the plural forms as well, unless the context clearly indicates otherwise. Additionally, the terms "comprises," "includes," "has," and related forms of each, when used in this specification, specify the presence of stated features, but do not preclude the presence or addition of one or more other features and/or groups thereof.

As also used herein, a layer is a transparent layer when the layer allows at least ten percent of radiation having a target wavelength, which is radiated at a normal incidence to an interface of the layer, to pass there through. Furthermore, as used herein, a layer is a reflective layer when the layer reflects at least ten percent of radiation having a target wavelength, which is radiated at a normal incidence to an interface of the layer. In an embodiment, the target wavelength of the radiation corresponds to a wavelength of radiation emitted or sensed (e.g., peak wavelength+/−five nanometers) by an active region of an optoelectronic device during operation of the device. For a given layer, the wavelength can be measured in a material of consideration and can depend on a refractive index of the material. Additionally, as used herein, a contact is considered "ohmic" when the contact exhibits close to linear current-voltage behavior over a relevant range of currents/voltages to enable use of a linear dependence to approximate the current-voltage relation through the contact region within the relevant range of currents/voltages to a desired accuracy (e.g., +/−one percent).

It is understood that, unless otherwise specified, each value is approximate and each range of values included herein is inclusive of the end values defining the range. Terms of degree such as "generally," "substantially," "about," and "approximately" as used herein mean a reasonable amount of deviation of the modified term such that the end result is not significantly changed. For example, these terms can be construed as including a deviation of at least +/−0.5% of the modified term if this deviation would not negate the meaning of the word it modifies. In a more particular example, the term "approximately" is inclusive of values within +/−ten percent of the stated value, while the term "substantially" is inclusive of values within +/−five percent of the stated value when these deviations would not negate the meaning of the word each term modifies. Unless otherwise stated, two values are "similar" when the amount of deviation between the two values does not significantly change the result. In a more particular example, two values are similar when the smaller value is within +/−twenty-five percent of the larger value. A value, y, is on the order of a stated value, x, when the value y satisfies the formula $0.1x \leq y \leq 10x$.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A substrate comprising:

a first plurality of structures formed on a growth surface of the substrate, wherein the first plurality of structures are formed in a multi-periodic pattern, the multi-periodic pattern including a first plurality of groups of structures, wherein each group of structures has a first characteristic spacing between adjacent structures in the group of structures, and wherein each group of structures is separated from an adjacent group of structures by a second characteristic spacing, wherein the second characteristic spacing is at least 1.5 times larger than the first characteristic spacing, wherein the substrate is designed to have a semiconductor layer grown directly on the substrate, and wherein each group of structures includes a plurality of sides, wherein two sides of the plurality of sides of each group are aligned perpendicular to or in parallel with an A-plane of the substrate.

2. The substrate of claim 1, wherein each group of structures comprises a hexagonal arrangement of structures.

3. The substrate of claim 1, further comprising a second plurality of structures formed on the growth surface of the substrate, wherein the second plurality of structures are formed in a second multi-periodic pattern.

4. The substrate of claim 3, wherein the first multi-periodic pattern is embedded within the second multi-periodic pattern.

5. The substrate of claim 3, wherein the second plurality of structures have a characteristic lateral size at least 1.5 times larger than a characteristic lateral size of the first plurality of structures.

6. The substrate of claim 1, wherein each structure has a lateral size similar to the first characteristic spacing.

7. A semiconductor device comprising:

a substrate including a first plurality of structures formed on a growth surface of the substrate, wherein the first plurality of structures are formed in a multi-periodic pattern, the multi-periodic pattern including a first plurality of groups of structures, wherein each group of structures has a first characteristic spacing between adjacent structures in the group of structures, and wherein each group of structures is separated from an adjacent group of structures by a second characteristic spacing, wherein the second characteristic spacing is at least 1.5 times larger than the first characteristic spacing; and a semiconductor layer grown directly on the substrate, wherein each group of structures includes a plurality of sides, wherein two sides of the plurality of sides of each group are aligned perpendicular to or in parallel with an A-plane of the substrate.

8. The semiconductor device of claim 7, wherein each group of structures comprises a hexagonal arrangement of structures.

9. The semiconductor device of claim 7, further comprising a second plurality of structures formed on the growth surface of the substrate, wherein the second plurality of structures are formed in a second multi-periodic pattern.

10. The semiconductor device of claim 7, wherein the semiconductor layer has a thickness sufficient for the semiconductor material to coalesce above a spacing between adjacent groups of structures.

11. The semiconductor device of claim 7, wherein the semiconductor layer comprises a buffer layer, the semiconductor device further including a plurality of active layers grown on the semiconductor layer.

12. The semiconductor device of claim 11, wherein the active layers are configured to operate as an optoelectronic device.

13. A method of fabricating a semiconductor structure, the method comprising:

forming a first plurality of structures formed on a growth surface of a substrate, wherein the first plurality of structures are formed in a multi-periodic pattern, the multi-periodic pattern including a first plurality of groups of structures, wherein each group of structures has a first characteristic spacing between adjacent structures in the group of structures, and wherein each group of structures is separated from an adjacent group of structures by a second characteristic spacing, wherein the second characteristic spacing is at least 1.5 times larger than the first characteristic spacing; and growing a semiconductor layer directly on the substrate, wherein each group of structures includes a plurality of sides, wherein two sides of the plurality of sides of each group are aligned perpendicular to or in parallel with an A-plane of the substrate.

14. The method of claim 13, wherein the forming the first plurality of structures includes etching the substrate.

15. The method of claim 13, wherein the growing causes the semiconductor layer to coalesce into a substantially contiguous layer.

16. The method of claim 13, further comprising growing a plurality of active layers on the semiconductor layer.

17. The method of claim 13, wherein each group of structures comprises a hexagonal arrangement of structures.

* * * * *